United States Patent
Toyoda et al.

(10) Patent No.: US 6,436,220 B1
(45) Date of Patent: Aug. 20, 2002

(54) PROCESS FOR THE COLLECTIVE REMOVAL OF RESIST MATERIAL AND SIDE WALL PROTECTIVE FILM

(75) Inventors: Eiji Toyoda; Makoto Namikawa; Kouichi Hashimoto, all of Osaka; Seiichiro Shirai, Tokyo, all of (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/367,099

(22) PCT Filed: Feb. 6, 1998

(86) PCT No.: PCT/JP98/00509
§ 371 (c)(1),
(2), (4) Date: Aug. 10, 1999

(87) PCT Pub. No.: WO98/36445
PCT Pub. Date: Aug. 20, 1998

(30) Foreign Application Priority Data

Feb. 12, 1997 (JP) .............................................. 9-027399

(51) Int. Cl.[7] ....................... B32B 31/20; H01L 21/027; H01L 21/3065
(52) U.S. Cl. ................. 156/247; 156/275.5; 156/275.7; 156/344; 216/43; 216/46
(58) Field of Search ............................. 156/247, 275.5, 156/275.7, 344, 584; 216/43, 46

(56) References Cited

U.S. PATENT DOCUMENTS

| 5,466,325 A | | 11/1995 | Mizuno et al. | |
|---|---|---|---|---|
| 5,474,650 A | * | 12/1995 | Kumihashi et al. | |
| 5,630,904 A | * | 5/1997 | Aoyama et al. | |
| 5,759,336 A | * | 6/1998 | Yamamoto et al. | 156/344 X |
| 5,780,142 A | | 7/1998 | Kume et al. | |
| 5,853,602 A | * | 12/1998 | Shoji | 216/46 |
| 5,895,740 A | * | 4/1999 | Chien et al. | 216/46 X |
| 6,086,701 A | * | 7/2000 | Namikawa | 156/247 |
| 6,099,675 A | * | 8/2000 | Yamamoto et al. | 156/247 X |
| 6,126,772 A | * | 10/2000 | Yamamoto et al. | 156/247 |

FOREIGN PATENT DOCUMENTS

| JP | 8-8153 | * | 1/1996 |
|---|---|---|---|
| JP | 8-236434 | * | 9/1996 |
| JP | 8-302310 | * | 11/1996 |
| JP | 8-305042 | * | 11/1996 |
| WO | 97/00534 | * | 1/1997 |

* cited by examiner

*Primary Examiner*—Curtis Mayes
(74) *Attorney, Agent, or Firm*—Whitham, Curtis & Christofferson, PC

(57) ABSTRACT

The present invention is intended to collectively remove unnecessary resist material and side wall protective film after dry etching by side wall protection process, making it possible to simplify the process for the preparation of semiconductors, etc. The process according to the present invention comprises removing unnecessary resist material (3) left behind after dry etching by side wall protection process with a resist pattern (3) present on a semiconductor substrate (2) as a mask and side wall protective film (4) deposited on the side wall (22) of pattern, said process comprising the steps of applying an pressure-sensitive adhesive sheet (1) to said substrate (2), heating the pressure-sensitive adhesive layer (1) under pressure so that the pressure-sensitive adhesive (11) comes in contact with up to the side wall (4) of pattern, and then collectively peeling said pressure-sensitive adhesive sheet (1), said resist material (3) and said side wall protective film (4) off said substrate.

5 Claims, 2 Drawing Sheets

PROCESS FOR THE COLLECTIVE REMOVAL OF RESIST MATERIAL AND SIDE WALL PROTECTIVE FILM

TECHNICAL FIELD

The present invention relates to a process for the removal of unnecessary resist material on an object such as semiconductor wafer and side wall protective film which has been deposited on the side wall of pattern during dry etching at a step of forming fine pattern during the preparation of semiconductors, circuits, various printed circuit boards, various masks, lead frames, etc.

In the process for the preparation of semiconductors, a resist pattern is formed, e.g., on a silicon wafer. With this resist pattern as a mask, the substrate is the subjected to injection of impurity ions, dry etching, etc. Unnecessary resist material is then removed normally by means of an asher (carbonization apparatus). In this manner, circuit elements or wiring are formed.

The foregoing dry etching is preferably carried out by side wall protection process to attain etching anisotropy. In some detail, this process involves the incorporation of a polymer-forming gas (e.g., halocarbon gas such as $CCl_4$ and $CF_4$) in an ionized etching gas for etching an object such as semiconductor substrate with a resist pattern as a mask, whereby a polymer protective layer is formed on the side wall of the pattern to prevent radicals from entering into the side wall of the pattern, making it possible to effect anisotropic etching free from side etching (see FIG. 4).

However, such a side wall protection process is disadvantageous in that the removal of resist material by an asher after etching cannot be accompanied by the removal of the foregoing side wall protective film and it is thus necessary to add a separate step of cleaning the side wall protective film after the preceding steps. Thus, the side wall protection process is liable to disadvantages in production process.

Under these circumstances, an object of the present invention is to collectively remove unnecessary resist material and side wall protective film after dry etching by side wall protection process, thereby simplifying the process for the preparation of semiconductors, etc.

DISCLOSURE OF THE INVENTION

The inventors made extensive studies of the foregoing object. As a result, it was found that the use of a process which comprises applying a pressure-sensitive adhesive sheet to an object which has been subjected to dry etching by side wall protection process, and then peeling the pressure-sensitive adhesive sheet of the object makes it possible to collectively remove resist material and side wall protective film therefrom. The present invention has thus been worked out.

The present invention concerns a process for the collective removal of resist material and side wall protective film which comprises removing unnecessary resist material left behind after dry etching by side wall protection process with a resist pattern present on an object as a mask and side wall protective film deposited on the side wall of pattern, said process comprising the steps of applying a sheet-like or tape-like pressure-sensitive adhesive sheet to the object, heating the pressure-sensitive adhesive sheet under pressure so that the pressure-sensitive adhesive comes in contact with up to the side wall of pattern, and then collectively peeling the pressure-sensitive adhesive sheet, the resist material and the side wall protective film off the object.

BEST EMBODIMENTS TO CARRY OUT THE INVENTION

Embodiments of the implication of the present invention will be described hereinafter in connection with FIGS. 1 to 4.

Figure 1:
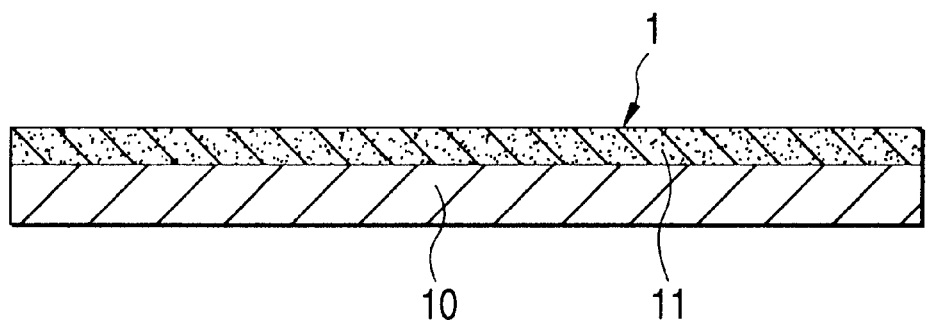
FIG. 1 is a sectional view illustrating an example of pressure-sensitive adhesive sheet used in the present invention.

FIG. 1 illustrates the structure of a pressure-sensitive adhesive sheet used in the present invention.

In FIG. 1, a pressure-sensitive adhesive sheet 1 is in the form of sheet or tape, which comprises a film substrate 10 having a thickness of normally from 10 to 100 $\mu$m and being made of plastic such as polyethylene, polypropylene and polyethylene terephthalate and a pressure-sensitive adhesive layer 11 having a thickness of normally from 10 to 200 $\mu$m provided thereon. The foregoing pressure-sensitive adhesive layer 2 may be of either non-curing type or curing type which is cured by actinic energy such as heat and ultraviolet rays, preferably of ultraviolet-curing type.

As such an ultraviolet-curing type pressure-sensitive adhesive there is preferably used one obtained by a process which comprises blending an acrylic polymer as a pressure-sensitive adhesive polymer with a nonvolatile low molecular compound having a molecular weight of normally not more than 10,000 containing one or more polymerizable carbon-carbon double bonds per molecule (hereinafter referred to as "curable compound") and a photopolymerization initiator and then optionally with a crosslinking agent such as polyfunctional compound (e.g., polyisocyanate, polyepoxy, various metal salts, chelate compound), a filler such as particulate silica, a tackifying resin, a colorant, an age resistor, a polymerization inhibitor or other additives. The normal lower limit of the molecular weight of such a curable compound is 100. The pressure-sensitive adhesive strength is preferably not less than 150 g/10 mm (normally from 200 to 1,000 g/10 mm width) before curing by ultraviolet rays and less than 150 g/10 mm (normally from 10 to 100 g/10 mm width) after curing by ultraviolet rays as calculated in terms of 180° peel adhesive strength with respect to silicon wafer.

The amount of other various components to be blended with respect to 100 parts by weight of the acrylic polymer are as follows.

Curable compound: normally from 5 to 300 parts by weight, preferably from 20 to 200 parts by weight;

Photopolymerization initiator: normally from 0.1 to 15 parts by weight, preferably from 0.5 to 10 parts by weight;

Crosslinking agent: normally not more than 20 parts by weight, preferably not more than 10 parts by weight;

Additives other than curable compound and photopolymerization initiator: normally from 0.1 to 15 parts by weight in total As the acrylic polymer there is preferably used a polymer having a weight-average molecular weight of normally from 300,000 to 2,000,000 and being made of a homopolymer of (meth)acrylic acid alkylester, or a copolymer of the foregoing monomer with carboxyl group- or hydroxyl group-containing monomers, other monomers for modification or the like. Examples of the curable compound include trimethylolpropane tri(meth)acrylate, tetramethylolmethane tri(meth)acrylate, tetramethylolmethane tetra(meth)acrylate, oligoester (meth)acrylate, and urethane (meth)acrylate-based oligomer. Examples of the photopolymerization initiator include benzoin, benzoin ethyl ether, dibenzyl, isopropyl benzoin ether, benzophenone, Michler's ketone chlorothioxanthone, dodecyl thioxanthone, dimethyl thioxanthone, acetophenone diethyl ketal, benzyl dimethyl ketal, and α-hydroxycyclohexyl phenyl ketone.

Figure 2:
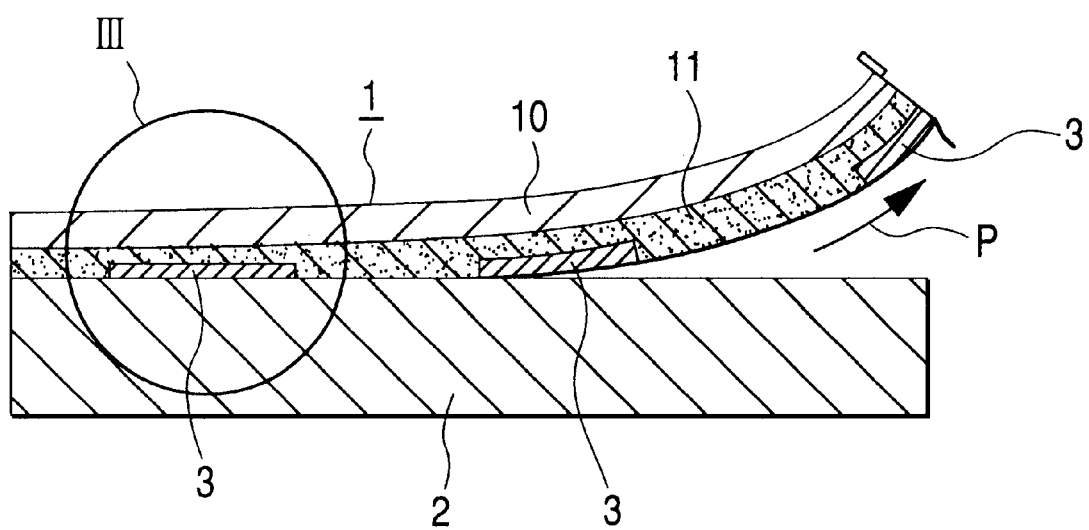
FIG. 2 is a sectional view illustrating the process for the collective removal of resist material and side wall protective film according to the present invention.
Figure 3:
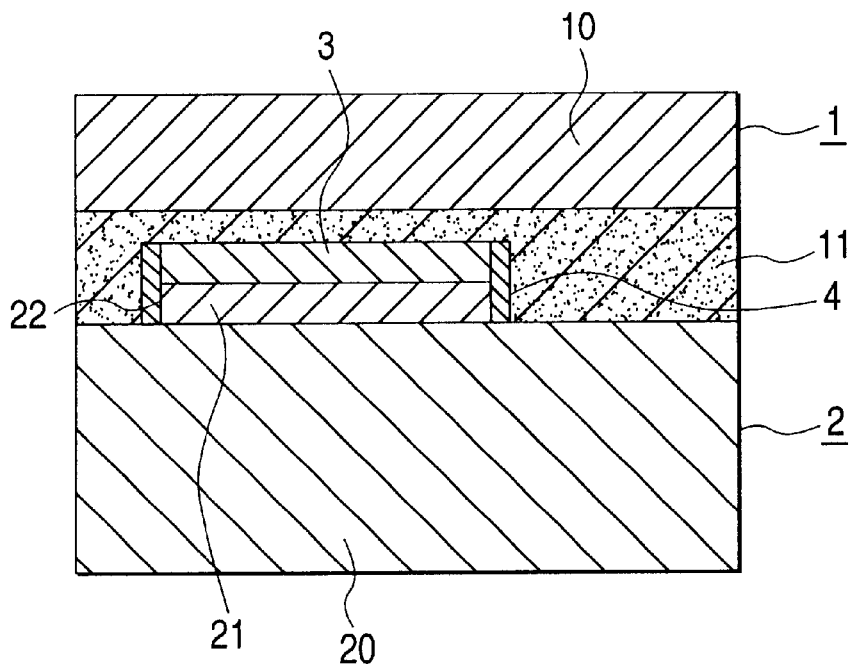
FIG. 3 is an enlarged sectional view illustrating the portion III of FIG. 2.

FIG. 2 illustrates a process for peeling resist material and side wall protective film off an object such as semiconductor substrate with a pressure-sensitive adhesive sheet having the foregoing structure. The arrow P indicates the direction along which the pressure-sensitive adhesive sheet is peeled off the object. FIG. 3 is an enlarged view of the portion III of FIG. 2.

Figure 4:
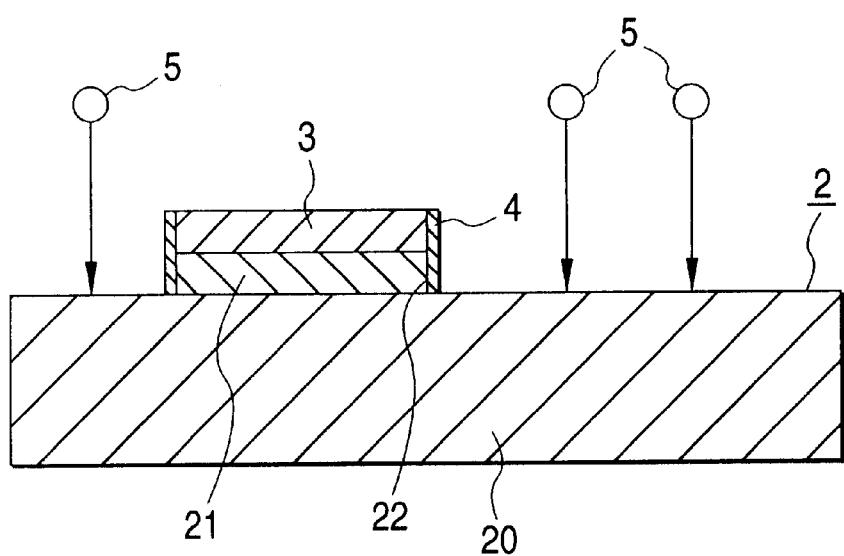
FIG. 4 is a sectional view illustrating how dry etching is effected by side wall protection process with a resist pattern as a mask.

As shown in FIG. 4 for example, the foregoing resist material is applied to the whole surface of a semiconductor substrate 2 comprising a wiring thin metal layer 21 provided on a silicon wafer 20, and then subjected to ordinary photographic process to form a predetermined resist pattern (resist film image) 3 thereon. The foregoing side wall protective film is a polymer protective layer 4 deposited on the side wall 22 of pattern during the formation of a desired wiring circuit involving dry etching by side wall protection process on the foregoing thin metal layer 21 with the resist pattern 3 as a mask.

The arrangement of the side wall protective film 4 makes it possible to prevent radicals from entering into the side wall 22 during dry etching of the thin metal layer 21 with ionized etching gas 5 and hence allow anisotropic etching free from side etching. For the formation of such a protective film 4, the etching gas normally comprises a polymer-forming gas incorporated therein. As necessary, such a polymer-forming gas may be separated and generated from, the material to be etched such as photoresist itself For the assembly of such a side wall protection process, it is normally preferred that microwave plasma etching process, which can independently control ion energy and plasma formation, be employed. The etching operation can be carried out according to known methods.

In the present invention, as shown in FIGS. 2 and 3, a pressure-sensitive adhesive sheet 1 is applied to a semiconductor substrate 2. During this procedure, the pressure-sensitive adhesive sheet 1 is heated under pressure so that the pressure-sensitive adhesive layer 11 is plasticized to come in full contact with up to the side wall 22 of pattern. These conditions can be properly determined depending on how the resist pattern 3 is attached to the substrate, the kind of the pressure-sensitive adhesive used, etc. In general, however, it is preferred that the pressure-sensitive adhesive sheet be heated to a temperature of from 20° C. to 150° C. so that the pressure-sensitive adhesive does not harden or protrude to the side wall at a pressure range as wide as from manual pressure to roll pressure.

The pressure-sensitive adhesive sheet 1 which has been applied to the substrate, if it is of ultraviolet-curing type, is irradiated with ultraviolet rays so that it is cured, and then peeled off the substrate in the direction shown by the arrow P as shown in FIG. 2. In this manner, the resist material (resist pattern) on the semiconductor substrate 2 and the side wall protective film 4 on the side wall 22 of pattern can be peeled off the substrate collectively with the pressure-sensitive adhesive sheet 1. Thus, by peeling the pressure-sensitive adhesive sheet 1, the resist material and the side wall protective film can be collectively removed. As a result, the necessity of adding conventional cleaning step can be eliminated, making it possible to drastically simplify the procedure.

The present invention will be further described in the following examples. The term "parts" as used hereinafter is meant to indicate "parts by weight".

REFERENCE EXAMPLE 1

To a silicon wafer having a wiring multi-layer thin metal layer formed on the surface thereof was applied a positive photoresist comprising a cresol novolac resin, a naphthoquinone diazide sulfonic acid ester of polyhydroxy compound, and ethyl lactate. The coated material was heated, exposed to light, and then subjected to development to form a resist pattern thereon. Thereafter, the coated material was subjected to dry etching by side wall protection process with this resist pattern as a mask to form a desired metal wiring pattern.

EXAMPLE 1

A monomer mixture of 80 parts of n-butyl acrylate, 15 parts of ethyl acrylate and 5 parts of acrylic acid was allowed to undergo solution polymerization with 150 parts of ethyl acetate and 0.1 parts of azobisisobutyronitrile at a temperature of 60° C. in a stream of nitrogen for 12 hours to obtain a solution A of acrylic polymer having a weight-average molecular weight of 560,000.

To the solution A were then added a polyethylene glycol diacrylate, dipentaerythritol hexacrylate and trimethylol propane triacrylate as curable compounds in an amount of 10 parts, 10 parts and 30 parts, respectively, based on 100 parts of the acrylic polymer, diphenylmethane diisocyanate as a polyfunctional compound in an amount of 3 parts by weight based on 100 parts of the acrylic polymer and α-hydroxycyclohexyl phenyl ketone as a photopolymerization initiator in an amount of 3 parts based on 100 parts of the acrylic polymer. The monomer was then uniformly stirred to prepare an ultraviolet-curing type pressure-sensitive adhesive solution.

The ultraviolet-curing type pressure-sensitive adhesive solution thus prepared was applied to a polyester film having a thickness of 50 μm to provide a dry thickness of 45 μm, and then dried at a temperature of 130° C. for 3 minutes to prepare an ultraviolet-curing type pressure-sensitive adhesive sheet. The pressure-sensitive adhesive sheet thus prepared exhibited a 180° peel adhesive strength of 235 g/10 mm width before curing by ultraviolet rays and 13 g/10 mm width after curing by ultraviolet rays, each with respect to silicon wafer.

Subsequently, to a silicon wafer having a metal wiring pattern, a resist material (resist pattern) and a side wall protective film formed thereon according to the method of Reference Example 1 was contact-bonded the foregoing ultraviolet-curing type pressure-sensitive adhesive sheet over a 130° C. hot plate. The laminate thus obtained was then irradiated with ultraviolet rays from a high pressure mercury lamp at a dose of 1,000 mj/cm$^2$ so that it was cured. The pressure-sensitive adhesive sheet thus cured was then peeled of the substrate. As a result, the resist material and the side wall protective film were removed away collectively with the pressure-sensitive adhesive sheet.

After the above-described peeling procedure, the surface and section of the silicone wafer were observed under fluorescent microscope and SEM (scanning type electron microscope), respectively. As a result, it was confirmed that the side wall protective film had been completely removed away with the resist material. In Example 1, the application of the pressure-sensitive adhesive sheet was effected also at a temperature of 90° C. In this case, too, the side wall protective film was removed away as well. However, the observation of section of wafer under SEM showed that the side wall protective film had been partially left behind. It was thus found that the temperature at which the pressure-sensitive adhesive sheet is applied is preferably higher than 90° C. to allow complete removal of the side wall protective film as effected in Example 1.

EXAMPLE 2

To the acrylic polymer solution A obtained in Example 1 were added a polyethylene glycol methacrylate and trimethylol propane triacrylate as curable compounds in an amount of 20 parts and 30 parts, respectively, based on 100 parts of the acrylic polymer, tolylene diisocyanate as a polyfunctional compound in an amount of 3 parts based on 100 parts of the acrylic polymer and α-hydroxycyclohexyl phenyl ketone as a polymerization initiator in an amount of 5 parts based on 100 parts of the acrylic polymer. The mixture was then uniformly stirred to prepare an ultraviolet-curing type pressure-sensitive adhesive solution.

The pressure-sensitive adhesive solution thus prepared was then processed in the same manner as in Example 1 to prepare an ultraviolet-curing type pressure-sensitive adhesive sheet. The pressure-sensitive adhesive sheet thus prepared exhibited a 180° peel adhesive strength of 538 g/10 mm width before curing by ultraviolet rays and 12 g/10 mm width after curing by ultraviolet rays, each with respect to silicon wafer. Using this ultraviolet-curing type pressure-sensitive adhesive sheet, the resist material and the side wall protective film were then peeled in the same manner as in Example 1. As a result, the resist material and the side wall protective film were removed collectively with the pressure-sensitive adhesive sheet. The surface and section of the silicone wafer were observed under fluorescent microscope and SEM (scanning type electron microscope), respectively. As a result, it was confirmed that the side wall protective film had been completely removed away with-the resist material.

In these examples, 180° peel adhesive strength was measured as follows.

The pressure-sensitive adhesive sheet in the form of strip having a length of 100 mm and a width of 10 mm is applied to the silicon wafer. The pressure-sensitive adhesive sheet was then heated to a temperature of 130° C. for 30 seconds. As necessary, the laminate is then irradiated from the substrate side thereof with ultraviolet rays from a high pressure mercury vapor lamp at a dose of 1 J/cm² so that the pressure-sensitive adhesive is cured. The pressure-sensitive adhesive sheet thus treated is then measured for peel strength at a peeling angle of 180° at a peeling rate of 300 mm/min. The measurement is effect at a temperature of 23° C. and a relative humidity of 65%.

Comparative Example 1

The silicon wafer having a metal wiring pattern, a resist material (resist pattern) and a side wall protective film formed thereon according to the method of Reference Example 1 was subjected to ashing with oxygen plasma. The surface and section of the silicone wafer were observed under fluorescent microscope and SEM (scanning type electron microscope), respectively. As a result, it was confirmed that the resist material had been removed away. However, the side wall protective film was shown partially left behind, demonstrating that the protective film can hardly be removed collectively with the resist material.

INDUSTRIAL APPLICABILITY

As mentioned above, the present invention provides a process which comprises applying a pressure-sensitive adhesive sheet to an object after dry etching by side protection process with a resist pattern on the object as a mask, and then peeling the pressure-sensitive adhesive sheet, whereby unnecessary resist material can be removed collectively with side wall protective film, making it possible to simplify the process for the preparation of semiconductors, etc.

What is claimed is:

1. A process for the collective removal of resist material and side wall protective film which comprises removing unnecessary resist material left behind after dry etching by side wall protection process with a resist pattern present on an object as a mask and side wall protective film deposited on the side wall of pattern, said process comprising the steps of:
   (A) applying a pressure-sensitive adhesive sheet to said object,
   (B) heating the pressure-sensitive adhesive sheet under pressure so that the pressure-sensitive adhesive comes in contact with the side wall of pattern, and then
   (C) collectively peeling said pressure-sensitive adhesive sheet, said resist material and said side wall protective film off said object.

2. The process for the collective removal of resist material and side wall protective film according to claim 1, wherein said object is a silicon wafer, said pressure-sensitive adhesive is of ultraviolet-curing type, said process comprises the steps of allowing said pressure-sensitive adhesive to come in contact with said silicon wafer, irradiating said pressure-sensitive adhesive with ultraviolet rays to cure said pressure-sensitive adhesive and then collectively peeling said pressure-sensitive adhesive sheet with said resist material and side wall protective film, and said pressure-sensitive adhesive exhibits a peel adhesive strength of not less than 150 g/10 mm before curing by ultraviolet rays and less than 150 g/10 mm after curing by ultraviolet rays with respect to silicon wafer.

3. The process for the collective removal of resist material and side wall protective film according to claim 2, wherein said pressure-sensitive adhesive comprises an acrylic polymer, a nonvolatile low molecular compound having a molecular weight of not more than 10,000 and containing one or more polymerizable carbon-carbon double bonds per molecule, and a photopolymerization initiator.

4. The process for the collective removal of resist material and side wall protective film according to claim 3, wherein said pressure-sensitive adhesive comprises a nonvolatile low molecular compound having a molecular weight of not more than 10,000 and containing one or more polymerizable carbon-carbon double bonds per molecule and a photopolymerization initiator incorporated therein in an amount of from 5 to 300 parts by weight and from 0.1 to 15 parts by weight, respectively, based on 100 parts by weight of said acrylic polymer.

5. A process for the collective removal of resist material and side wall protective film, for removing unnecessary resist material left behind after dry etching by side wall protection process with a resist pattern present on an object as a mask and side wall protective film deposited on the side wall of pattern, said process consisting essentially of the steps of
   (A) applying a pressure-sensitive adhesive sheet to said object,
   (B) heating the pressure-sensitive adhesive sheet under pressure so that the pressure-sensitive adhesive comes in contact with the side wall of pattern, and then
   (C) collectively peeling said pressure-sensitive adhesive sheet, said resist material and said side wall protective film off said object.

* * * * *